(12) United States Patent
Murakami et al.

(10) Patent No.: US 8,712,707 B2
(45) Date of Patent: Apr. 29, 2014

(54) POWER COLLECTING DEVICE, POWER MEASURING DEVICE, AND POWER COLLECTING METHOD

(75) Inventors: Takashi Murakami, Osaka (JP); Keiji Sakaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 422 days.

(21) Appl. No.: 13/260,803

(22) PCT Filed: Dec. 24, 2010

(86) PCT No.: PCT/JP2010/007495
§ 371 (c)(1),
(2), (4) Date: Sep. 28, 2011

(87) PCT Pub. No.: WO2011/089678
PCT Pub. Date: Jul. 28, 2011

(65) Prior Publication Data
US 2012/0022815 A1 Jan. 26, 2012

(30) Foreign Application Priority Data

Jan. 22, 2010 (JP) ................................. 2010-012544

(51) Int. Cl.
*G06F 19/00* (2011.01)
*G01R 21/133* (2006.01)
(52) U.S. Cl.
USPC ............. 702/62; 702/188; 709/224; 709/220; 709/230
(58) Field of Classification Search
CPC ....... G01D 4/00; G01R 22/063; G06Q 50/06; G06Q 10/109; G06F 13/22; G06F 1/14; H04L 29/06; H04L 67/02; H04L 67/42; H04L 69/18; H04L 12/403; H04L 69/28; H04L 67/06; H04L 69/14; H04B 7/24; H04W 74/06
USPC ............. 702/62, 79, 188; 709/208, 224, 221, 709/203, 220, 226, 223, 201, 230, 227, 237, 709/228
See application file for complete search history.

(56) References Cited

U.S. PATENT DOCUMENTS 6,282,183 B1 * 8/2001 Harris et al. .................. 370/338
6,539,003 B1   3/2003 Agarwal et al.
(Continued)

FOREIGN PATENT DOCUMENTS

JP          4-258050    9/1992
JP          5-76074     3/1993
(Continued)

OTHER PUBLICATIONS

International Search Report issued Feb. 8, 2011 in corresponding International Application No. PCT/JP2010/007495.

*Primary Examiner* — Carol S Tsai
(74) *Attorney, Agent, or Firm* — Wenderoth, Lind & Ponack, L.L.P.

(57) ABSTRACT

A power collecting device (101) according to the present invention includes: a polling interval determination unit configured to determine a polling interval (212) as a time interval at which measured data (220) is collected from an appliance (102); a band measurement unit configured to measure a communicable band (711) usable for communication between the power collecting device (101) and the appliance (102); a sampling interval determination unit (710) configured to determine a sampling interval (712) as an interval between measurement times of a plurality of measured values included in the measured data (220) so that a data volume of the measured data (220) becomes equal to or smaller than a data volume that can be communicated at the polling interval (212) by using the communicable band (711); and a data transmission request unit (204) configured to transmit, to the appliance (102) at the polling interval (212), a data transmission request message (213) requesting the appliance (102) for transmitting the measured data (220) including the measured value obtained through the measurement at the sampling interval (712).

13 Claims, 12 Drawing Sheets

(56) References Cited

U.S. PATENT DOCUMENTS

| | | | |
|---|---|---|---|
| 6,996,627 B1* | 2/2006 | Carden | 709/237 |
| 7,110,380 B2* | 9/2006 | Shvodian | 370/336 |
| 7,136,353 B2* | 11/2006 | Ha et al. | 370/230 |
| 7,392,309 B2* | 6/2008 | Childers et al. | 709/224 |
| 7,650,423 B2* | 1/2010 | Carden | 709/237 |
| 7,987,154 B2* | 7/2011 | Di Giglio et al. | 707/620 |
| 8,271,626 B2* | 9/2012 | Childers et al. | 709/221 |
| 2002/0105970 A1* | 8/2002 | Shvodian | 370/468 |
| 2002/0161885 A1* | 10/2002 | Childers et al. | 709/224 |
| 2003/0084175 A1* | 5/2003 | Kaniyar et al. | 709/230 |
| 2005/0209804 A1* | 9/2005 | Basso et al. | 702/79 |
| 2007/0027969 A1 | 2/2007 | Ishida | |
| 2007/0159321 A1 | 7/2007 | Ogata et al. | |
| 2008/0263150 A1* | 10/2008 | Childers et al. | 709/203 |
| 2009/0015418 A1* | 1/2009 | Koike | 340/636.1 |
| 2012/0020353 A1* | 1/2012 | Twitchell | 370/389 |
| 2013/0097227 A1* | 4/2013 | Childers et al. | 709/203 |

FOREIGN PATENT DOCUMENTS

| | | |
|---|---|---|
| JP | 7-322369 | 12/1995 |
| JP | 2000-505993 | 5/2000 |
| JP | 2007-34737 | 2/2007 |
| JP | 2007-184754 | 7/2007 |

* cited by examiner

FIG. 9

| Temporary division number | Temporary measured data acquisition time | Temporary polling interval | Temporary total data size | New division number |
|---|---|---|---|---|
| n = 1 | 1.4 seconds | 1.4 × 30 = 42 seconds | 42 × 10 = 420 bytes | n = 5 |
| n = 5 | 2.2 seconds | 2.2 × 30 = 66 seconds | 66 × 10 = 660 bytes | n = 7 |
| n = 7 | 2.6 seconds | 2.6 × 30 = 78 seconds | 78 × 10 = 780 bytes | n = 8 |
| n = 8 | 2.8 seconds | 2.8 × 30 = 84 seconds | 84 × 10 = 840 bytes | n = 9 |
| n = 9 | 3.0 seconds | 3.0 × 30 = 90 seconds | 90 × 10 = 900 bytes | n = 9 |

POWER COLLECTING DEVICE, POWER MEASURING DEVICE, AND POWER COLLECTING METHOD

TECHNICAL FIELD

The present invention relates to a power collecting device, a power measuring device, and a power collecting method, and more specifically to a power collecting device collecting, from an appliance connected to a network, measured data indicating, for example, current power consumption or accumulated power consumption of the appliance measured by the appliance.

BACKGROUND ART

In recent years, a system of collecting in real time current power consumption, accumulated power consumption, etc. of appliances such as a white good and an AV appliance connected to a home network has been realized. Collecting the power consumption and the accumulated power consumption of the appliances in this manner can clearly show to consumers unnecessary power usage in households. Moreover, acquiring the power consumption and the accumulated power consumption of the appliances in real time makes it possible to, for example, control the appliances so as to reduce power consumption.

Known as a conventional technology of data collection is a technology of changing a sampling interval in accordance with a polling interval and a technology of changing a polling interval in accordance with a sampling interval (for example, see Patent Literatures 1 and 2).

Also known as the conventional technology is the one that has a function of switching between transmission and non-transmission depending on a radio communication state (for example, see Patent Literature 3).

Moreover, Patent Literature 4 discloses a technology of changing a burst length in a communication system using a frame structure with a fixed cycle.

CITATION LIST

Patent Literature

[PTL 1] Japanese Patent Application Laid-open No. 2007-034737
[PTL 2] Japanese Patent Application Laid-open No. H4-258050
[PTL3] Japanese Patent Application Laid-open No. 2007-184754
[PTL 4] Japanese Unexamined Patent Application Publication No. 2000-505993

SUMMARY OF THE INVENTION

Technical Problem

However, it has been argued that the conventional technologies described above are based on not an environment called a home network where a plurality of services are mixed together but a network realizing a single service. In an actual home network, a plurality of services are mixed together, and thus a communication band that can be ensured varies depending on timing. Therefore, with the technologies of Patent Literatures 1 and 2, when a band dramatically has narrowed, data collection cannot be performed at a specified polling interval or a specified sampling interval in some cases.

Consequently, the conventional technologies face a problem that part of data is missed in some cases.

The invention solves the problem described above, and it is an object of the invention to provide a power collecting device, a power measuring device, and a power collecting method capable of realizing favorable data collection even when a network band has narrowed at time of communication.

Solution to Problem

To solve the problem described above, a power collecting device according to one embodiment of the invention is connected to a network and collects, from an appliance connected to the network, measured data including one or a plurality of pieces of at least one kind of data of current power consumption and accumulated power consumption of the appliance. The power collecting device includes: a polling interval determination unit configured to determine a polling interval as a time interval at which the measured data is collected from the appliance; a band measurement unit configured to measure a communicable band usable for communication between the power collecting device and the appliance; a sampling interval determination unit configured to determine a sampling interval as an interval between measurement times of a plurality of measured values included in the measured data so that a data volume of the measured data defined by the sampling interval and the polling interval becomes equal to or smaller than a data volume that can be communicated within the polling interval by using the communicable band; and a data transmission request unit configured to transmit, to the appliance at the polling interval, a request message requesting the appliance for transmitting the measured data including the measured value obtained through the measurement at the sampling interval.

With this configuration, the power collecting device according to one embodiment of the invention, when the communicable band has narrowed, can increase the sapling interval to reduce the data volume of the measured data transmitted by the appliance. Consequently, the power collecting device according to one embodiment of the invention can prevent loss of part of the measured data as a result of not completing the transmission of the measured data within the polling interval. As described above, the power collecting device according to one embodiment of the invention can realize favorable data collection even when a band of the network has narrowed at time of communication.

Moreover, the appliance may determine, based on an upper limit of a data volume of one message, whether or not to divide the measured data for transmission, and when the measured data is to be divided, divide the measured data into a plurality of pieces of division data and transmit the divided plurality of pieces of division data to the power collecting device, and when the measured data is not to be divided, transmit the measured data to the power collecting device without dividing the measured data, and the sampling interval determination unit may be configured: to determine, when the communicable band is wider than a predefined first band, the sampling interval as the predefined first interval; to calculate, when the communicable band is narrower than the first band, a division number that permits communication as the number of pieces of division data that can be communicated within the polling interval by using the communicable band; and to calculate a second interval by dividing the first interval by a ratio of the division number that permits communication with respect to a normal division number as the number of pieces of division data when the first interval is used, and determine the calculated second interval as the sampling interval.

With this configuration, the power collecting device according to one embodiment of the invention can realize favorable data collection even when the measured data is divided into a plurality of pieces of division data for transmission.

Moreover, the power collecting device may further include a target appliance management unit configured to hold the number of connections as the number of the appliances connected to the network, wherein the polling interval determination unit may be configured to determine the polling interval by using the number of connections, communication speed of the network, and network protocol specifications.

With this configuration, the power collecting device according to one embodiment of the invention can determine an appropriate polling interval based on the number of connections and the communication speed.

Moreover, the polling interval determination unit may be configured: to calculate, by using the communication speed and the network protocol specifications, a measured data acquisition time period as a time period from when the data transmission request unit transmits the request message to when the measured data is acquired; and to calculate the polling interval by multiplying together the measured data acquisition time period and the number of connections.

Moreover, the appliance may divide the measured data into a plurality of pieces of division data whose upper limits of data volumes are defined, and may transmit the divided plurality of pieces of division data to the power collecting device, and the polling interval determination unit may be configured: to set a predefined number as a first division number; to repeat: calculating, based on the communication speed, a temporary measured data acquisition time period as the measured data acquisition time period when the measured data is transmitted after divided into the first division number of pieces of division data; calculating a temporary polling interval by multiplying together the temporary measured data acquisition time period and the number of connections; calculating a temporary data volume as a data volume of the measured data with the temporary polling interval and the first division number; calculating a second division number by dividing the temporary data volume by a maximum data volume of the division data; and, when the first division number is different from the second division number, setting the second division number as a new first division number, until when the first division number and the second division number become equal to each other; and to determine the temporary polling interval as the polling interval when the first division number and the second division number become equal to each other.

With this configuration, the power collecting device according to one embodiment of the invention can determine an appropriate polling interval when the measured data is divided into the plurality of pieces of division data for transmission.

Moreover, the network protocol specifications may include an upper limit of a message size and communication sequence information, and the polling interval determination unit may be configured to calculate the measured data acquisition time period by using the communication speed of the network, the upper limit of the message size, and the communication sequence information.

With this configuration, the power collecting device according to one embodiment of the invention can determine an appropriate polling interval based on the number of connections, the communication speed, the message size and the communication sequence information.

Moreover, the power collecting device may further include: a data reception unit configured to receive the plurality of pieces of division data obtained by dividing the measured data; a received data coupling unit configured to couple together the pieces of division data received by the data reception unit; a missing data determination unit configured to determine, based on a parameter included in the division data, whether or not there is any missing data, and when there is any missing data, request the appliance for transmitting the missing data again; and a missing data reception unit configured to receive the missing data from the appliance, wherein the polling interval determination unit may be configured to calculate the measured data acquisition time period by multiplying a coefficient that considers occurrence of the missing data by the value calculated based on the communication speed.

With this configuration, the power collecting device according to one embodiment of the invention, even when there is any missing data, can perform retransmission processing on the missing data to thereby obtain the missing data. Moreover, the power collecting device according to one embodiment of the invention can calculate the measured data acquisition time period that considers a time period for processing of acquiring again this missing data.

Moreover, the target appliance management unit may be further configured to hold an address or a communication access destination of the appliance.

Moreover, a power collecting device according to one embodiment of the invention is connected to a network and collects, from an appliance connected to the network, measured data including a plurality of measured values indicating current power consumption of the appliance for each time measured by the appliance. The power collecting device may include: a target appliance management unit configured to hold the number of connections as the number of the appliances connected to the network; a timer interval determination unit configured to determine, based on the number of connections, communication speed of the network, and network protocol specifications, a timer interval as a time interval at which the appliance transmits the measured data to the power collecting device; and a data transmission request unit configured to transmit to the appliance a request message requesting the appliance for transmitting the measured data at the timer interval.

With this configuration, the power collecting device according to one embodiment of the invention can determine an appropriate timer interval based on the number of appliances connected to the network and the communication speed.

Moreover, a power measuring device according to one embodiment of the invention measures current power consumption of an appliance and transmits, to a power collecting device connected to a network, measured data including at least one of the current power consumption and accumulated power consumption, and includes: a measurement unit configured to measure the current power consumption of the appliance for each time and outputting a measured value obtained through the measurement; a transmission request reception unit configured to receive a request message transmitted from the power collecting device, the message including a timer interval as a time interval at which the power measuring device transmits the measured data to the power collecting device; a band measurement unit configured to measure a communicable band usable for communication between the power measuring device and the power collecting device; a sampling interval determination unit configured to determine a sampling interval as an interval between measurement times of a plurality of measured values included in the measured data so that a data volume of the measured data defined by the sampling interval and the timer interval becomes equal to or smaller than a data volume that can be communicated within the timer interval by using the communicable band; and a measured data transmission unit configured to transmit, to the power collecting device at the timer interval, the measured data including the measured value obtained through the measurement at the sampling interval.

With this configuration, the power measuring device according to one embodiment of the invention, when the communicable band has narrowed, can increase the sampling interval to thereby reduce the data volume of the measured data transmitted by the power measuring device. Consequently, the power measuring device according to one embodiment of the invention can prevent occurrence of conditions such as loss of the measured data and measurement delay as a result of not completing the transmission of the measured data within the timer interval. In this manner, even when the band of the network has narrowed, a power collecting system using the power measuring device according to one embodiment of the invention can realize favorable data collection.

Moreover, the measured data transmission unit may be configured to determine, based on an upper limit of a data volume of one message, whether or not to divide the measured data for transmission, and when the measured data is to be divided, divide the measured data into a plurality of pieces of division data and transmit the divided plurality of pieces of division data to the power collecting device, and when the measured data is not to be divided, transmit the measured data to the power collecting device without dividing the measured data, and the sampling interval determination unit may be configured: to determine the sampling interval as the predefined first interval when the communicable band is wider than a predefined first band; to calculate, when the communicable band is narrower than the first band, a division number that permits communication as the number of pieces of division data that can be communicated within the polling interval with the communicable band; and to calculate a second interval by dividing the first interval by a ratio of the division number that permits communication with respect to a normal division number as the number of pieces of division data when the first interval is used, and determine the calculated second interval as the sampling interval.

With this configuration, the power collecting system using the power measuring device according to one embodiment of the invention, when the measured data is divided into a plurality of pieces of division data for transmission, can realize favorable data collection.

The invention can be realized not only as such a power collecting device and such a power measuring device, but also as a power collecting method or a power measuring method having steps of characteristic means included in the power collecting device or the power measuring device, or as a program that causes a computer to execute such characteristic steps. Then it is needless to say that such a program can be circulated via a recording medium such as a CD-ROM and a transfer medium such as the Internet.

Further, the invention can be realized as a semiconductor integrated circuit (LSI) that realizes part or all of functions of such a power collecting device or such a power measuring device, can be realized as a household appliance provided with such a power measuring device, and can be realized as a power collecting system including such a power collecting device and such a power measuring device.

Advantageous Effects of the Invention

As described above, the invention can provide a power collecting device, a power measuring device, and a power collecting method capable of realizing favorable data collection even in a case where a band of a network has become narrower than that when a polling interval or a sampling interval is determined at time of communication, for example, at time of execution of a service using a different network and due to occurrence of noise.

BRIEF DESCRIPTION OF DRAWINGS

FIG. 9 is a diagram showing one example of data in the polling interval determination processing according to Embodiment 2 of the invention.

DESCRIPTION OF EMBODIMENTS

Hereinafter, the embodiments of the present invention will be described, with reference to the accompanying drawings.

(Embodiment 1)

A power collecting device according to Embodiment 1 of the invention, when a communicable band has narrowed, elongates a sampling interval to thereby reduce a data volume of measured data transmitted by an appliance. Consequently, the power collecting device according to Embodiment 1 of the invention can prevent loss or delay in acquisition of pieces of measured data 220 transmitted by different appliances due to, for example, collision between the pieces of measured data 220 on a network as a result of not completing transmission of the measured data within a polling interval. As described above, the power collecting device according to Embodiment 1 of the invention can realize favorable data collection even when a band of the network has narrowed at time of communication.

First, configuration of the power collecting device according to Embodiment 1 of the invention will be described.

Figure 1:
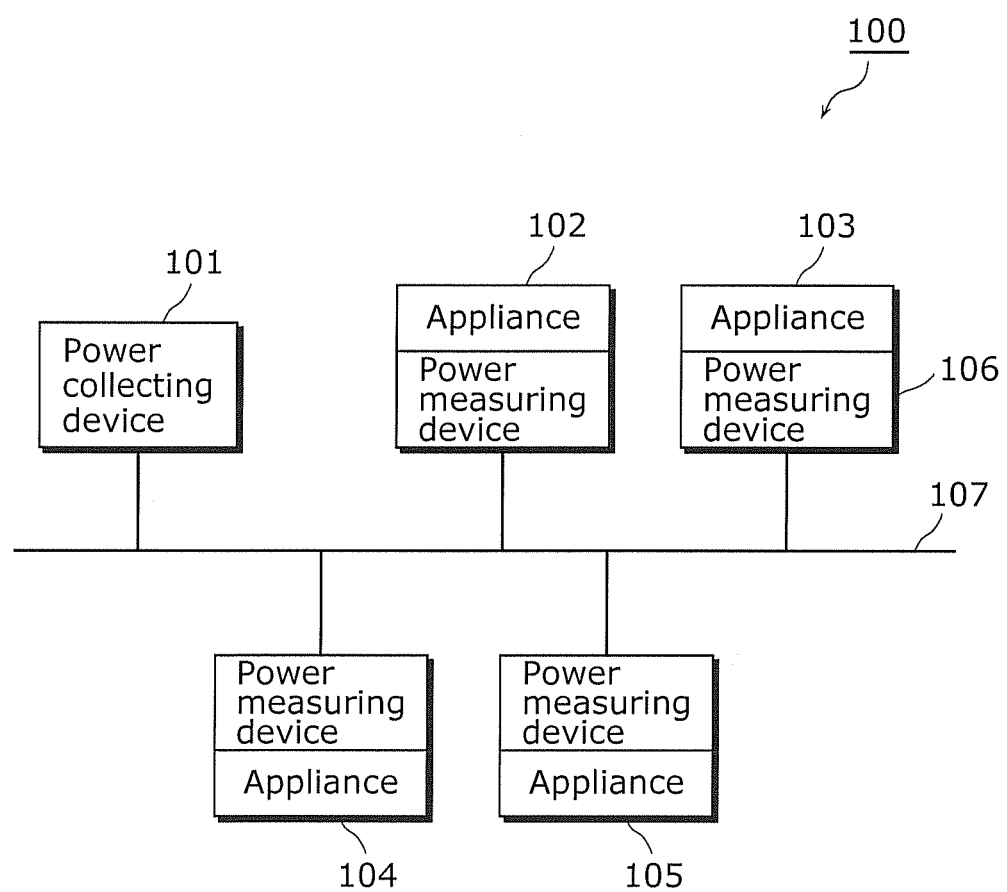
FIG. 1 is a diagram showing configuration of a power collecting system according to Embodiment 1 of the present invention.

FIG. 1 is a block diagram showing configuration of a power collecting system 100 according to Embodiment 1 of the invention.

The power collecting system 100 shown in FIG. 1 includes: a power collecting device 101, a plurality of appliances 102 to 105, power measuring devices 106, and a network 107, The power collecting device 101 and the plurality of appliances 102 to 105 are connected together via the network 107.

The power collecting device 101 collects information of power used by the appliances 102 to 105.

Each of the appliances 102 to 105 is a power-consuming appliance, such as an air conditioner, a television, or a refrigerator. Each of the appliances 102 to 105 includes the power measuring device 106. The power measuring device 106 measures power consumption of the appliances 102 to 105 at predetermined time intervals to calculate accumulated power consumption. Note that the power measuring device 106 may be built in each appliance or be connected to each appliance by an external adapter or the like.

The network 107 is, for example, a home network. Note that the network 107 may be a wire communication network or a wireless communication network, or may include both the wire communication network and the wireless communication network.

Figure 2:
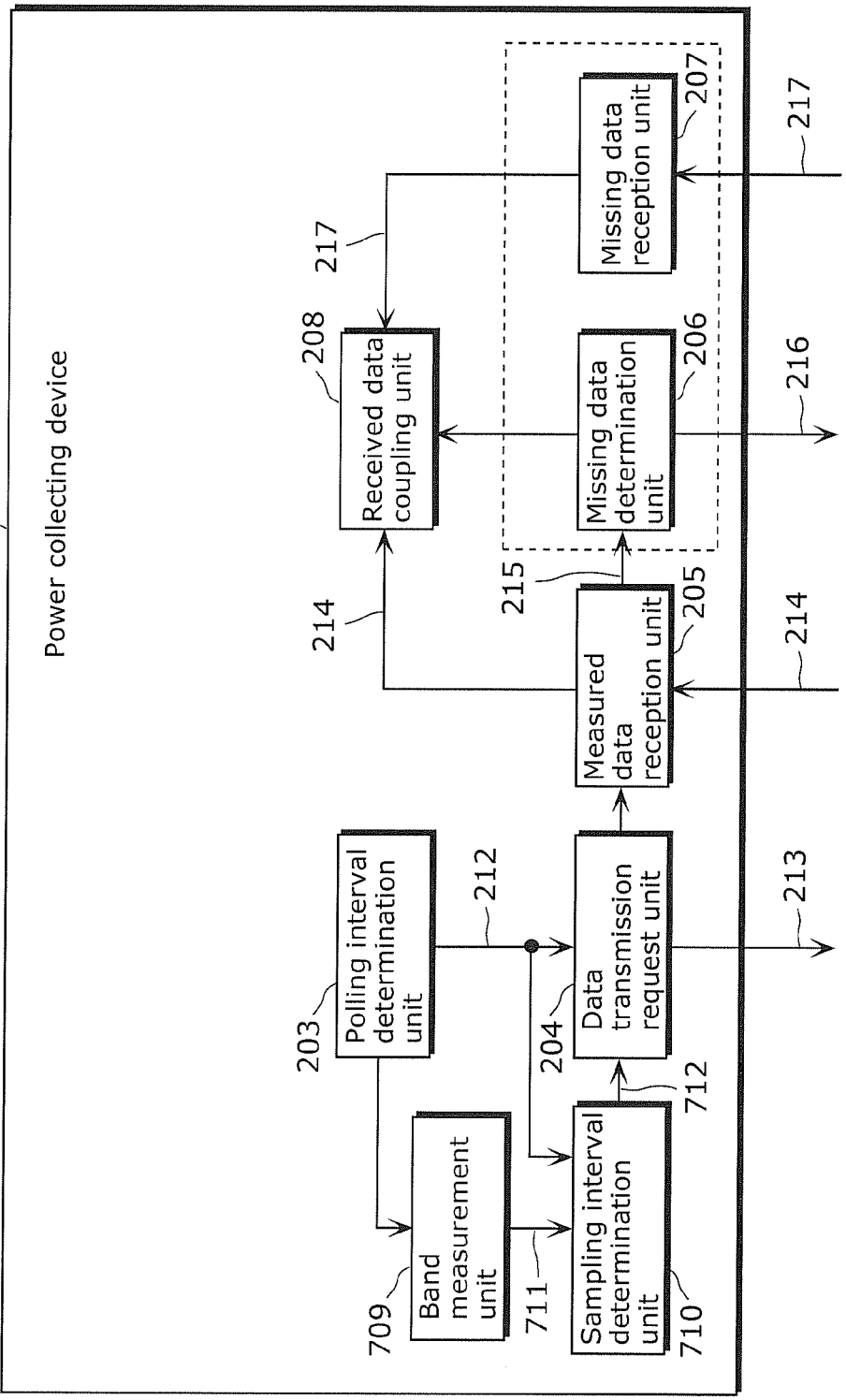
FIG. 2 is a block diagram of a power collecting device according to Embodiment 1 of the invention.

FIG. 2 is a block diagram showing functional configuration of the power collecting device 101.

The power collecting device 101 shown in FIG. 2 collects measured data 220 measured by the power measuring device 106 from this power measuring device 106. Here, the measured data 220 includes at least one of the power consumption and the accumulated power consumption of the appliances 102 to 105 for each time.

This power collecting device 101 includes: a polling interval determination unit 203, a data transmission request unit 204, a measured data reception unit 205, a missing data determination unit 206, a missing data reception unit 207, a received data coupling unit 208, a band measurement unit 709, and a sampling interval determination unit 710. Note that the power collecting device 101 is not required to include one or more of the missing data determination unit 206 and the missing data reception unit 207 surrounded by a dotted line.

The polling interval determination unit 203 determines a polling interval 212 and passes the determined polling interval 212 to the data transmission request unit 204. Here, the polling interval 212 is a time interval at which the power collecting device 101 collects the measured data 220 from each of the appliances 102 to 105. For example, the polling interval determination unit 203 determines as the polling interval 212 a predefined value or a value specified from outside.

The band measurement unit 709 measures a communicable band 711 of the network 107 that can be used for communication between the power collecting device 101 and the power measuring device 106. Moreover, the measurement of the communicable band 711 by the band measurement unit 709 is performed at timing at which the power collecting device 101 requests the appliances 102 to 105 for the measured data 220.

The sampling interval determination unit 710 determines a sampling interval 712 in a manner such that a data volume of the measured data 220 becomes equal to or smaller than a data volume that can be communicated at the polling interval 212 by using the communicable band 711. Here, the sampling interval 712 is an interval between measurement times of a plurality of measured values included in the measured data 220. That is, the data volume of the measured data 220 is determined by the sampling interval 712 and the polling interval 212. Specifically, the data volume of the measured data 220 is approximately a total data volume of the plurality of measured values obtained through the measurement at the sampling interval 712 at the polling interval 212.

The data transmission request unit 204 transmits a data transmission request message 213 to the power measuring device 106 connected to the network 107 at an interval indicated by the polling interval 212 received from the polling interval determination unit 203. This data transmission request message 213 includes information indicating the sampling interval 712. Moreover, the data transmission request message 213 is a request message that requests the power measuring device 106 for transmitting the measured data 220 including the measured values obtained through the measurement at this sampling interval 712. The data transmission request unit 204 notifies the measured data reception unit 205 that the data transmission request message 213 has been transmitted.

The measured data reception unit 205 receives division data 214 transmitted by the power measuring device 106 in accordance with the data transmission request message 213. Here, the division data 214 is a message including data obtained by dividing the measured data 220 measured by the power measuring device 106. Moreover, the power measuring device 106 successively transmits a plurality of pieces of division data 214 corresponding to one piece of measured data 220. The measured data reception unit 205 passes to the missing data determination unit 206 a serial number 215 indicating a fragment of the division data 214. Further, the measured data reception unit 205 passes the received division data 214 to the received data coupling unit 208.

The missing data determination unit 206 determines based on the serial number 215 whether or not all the pieces of division data 214 have been received. In other words, the missing data determination unit 206 determines whether or not there is any missing data. The missing data determination unit 206, if all the pieces of division data 214 have been received, notifies the received data coupling unit 208 that all has been received. Moreover, the missing data determination unit 206, if there is any missing data, transmits a missing data retransmission request message 216 including the serial number 215 of the missing data to the power measuring device 106 as a transmission source of the division data 214.

The missing data reception unit 207 receives missing division data 217 as a response of the power measuring device 106 to the missing data retransmission request message 216. Moreover, the missing data reception unit 207 passes the received missing division data 217 to the received data coupling unit 208.

The received data coupling unit 208, upon reception of all the pieces of division data 214, couples together the received plurality of pieces of division data 214 or the missing division data 217 and perform analysis of the coupled pieces of measured data 220.

Next, configuration of the power measuring device 106 will be described.

Figure 3:
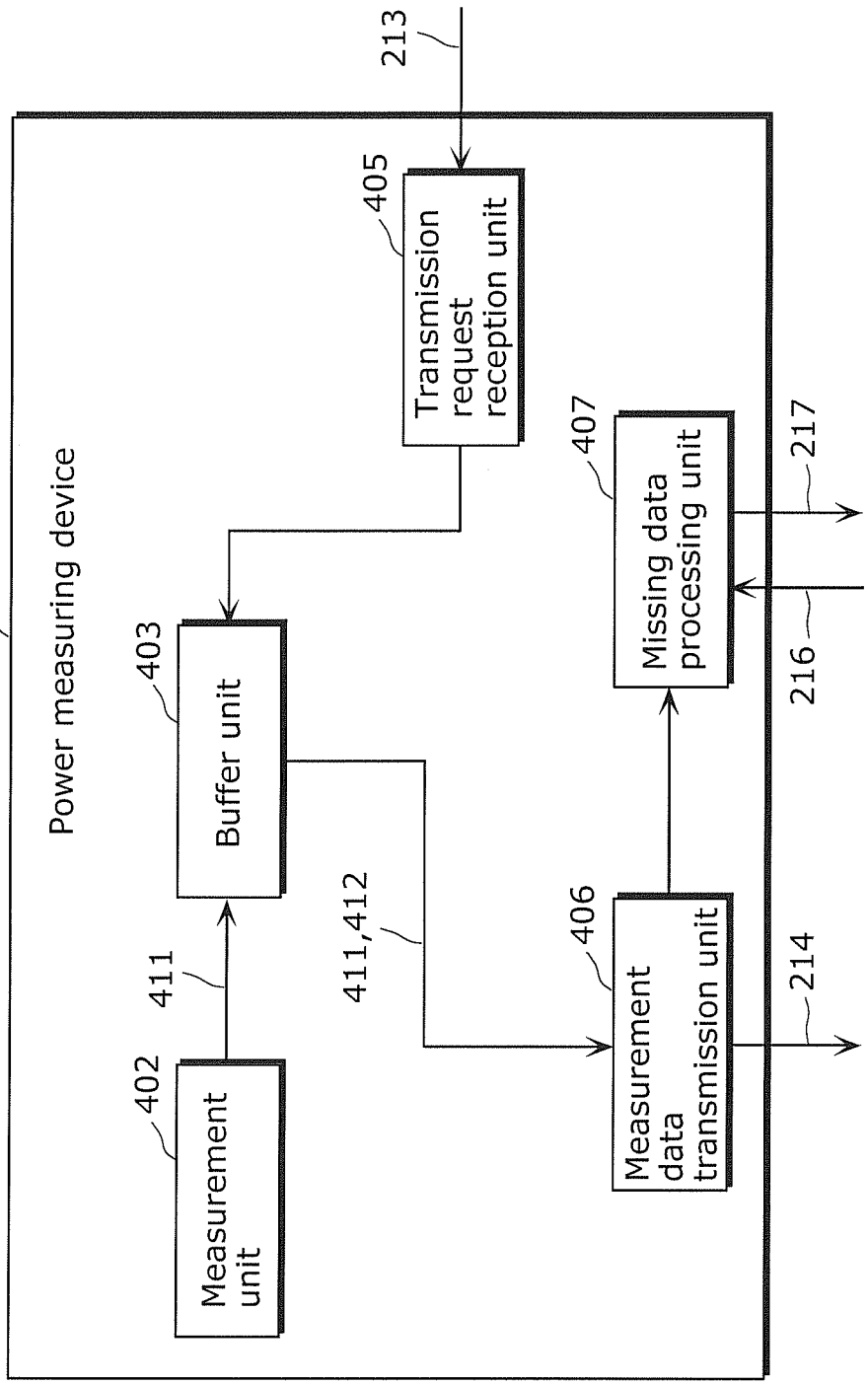
FIG. 3 is a block diagram of a power measuring device according to Embodiment 1 of the invention.

FIG. 3 is a diagram showing the configuration of the power measuring device 106. The power measuring device 106 includes: a measurement unit 402, a buffer unit 403, a transmission request reception unit 405, a measured data transmission unit 406, and a missing data processing unit 407.

The measurement unit 402 regularly measures the current power consumption of the appliance, and sequentially passes the measured current power consumption 411 to the buffer unit 403. For example, an interval between measurements by the measurement unit 402 is one second.

The buffer unit 403, upon reception of the current power consumption 411 at the one-second interval, calculates accumulated power consumption 412 based on the current power consumption 411. The buffer unit 403 also buffers the current power consumption 411 and the accumulated power consumption 412 at the one-second interval.

The transmission request reception unit 405, upon reception of the data transmission request message 213 that requests for transmitting the measured data 220, notifies the buffer unit 403 of the reception of the data transmission request message 213. At this point, the transmission request reception unit 405 passes to the buffer unit 403 the sampling interval 712 included in the data transmission request message 213 and address information of the power collecting device 101 that is a communication opposite party.

The buffer unit 403, upon reception from the transmission request reception unit 405 information of the reception of the data transmission request message 213, takes out the current power consumption 411 and the accumulated power consumption 412 to be transmitted. Then the buffer unit 403 passes to the measured data transmission unit 406 the current power consumption 411 and the accumulated power consumption 412, which have been taken out, together with transmission source information. Specifically, based on a value indicated by the sampling interval 712, the buffer unit 403 passes, to the measured data transmission unit 406, of the plurality of power consumption 411 and accumulated power consumption 412 measured within a time period corresponding to the polling interval 212, the current power consumption 411 and the accumulated power consumption 412 to be responded to the power collecting device 101.

The measured data transmission unit 406, based on data volumes of the current power consumption 411 and the accumulated power consumption 412 received from the buffer unit 403, determines a division number of the measured data 220. The measured data transmission unit 406 successively transmits the pieces of the division data 214 to a transmission destination.

Described here is that the power measuring device 106 transmits the current power consumption 411 and the accumulated power consumption 412 as the measured data 220, but the power measuring device 106 may transmit either of the current power consumption 411 and the accumulated power consumption 412. In this case, the buffer unit 403 may buffer, of the current power consumption 411 and the accumulated power consumption 412, only the one included in the data to be transmitted as the measured data 220, and pass this buffered data to the measured data transmission unit 406.

The missing data processing unit 407, if any data failed in the communication has been found in the division data 214, transmits only the relevant missing division data 217 again. Specifically, the missing data processing unit 407, upon reception of the missing data retransmission request message 216, transmits as the missing division data 217 to the power collecting device 101 the division data 214 specified by the serial number 215 included in this missing data retransmission request message 216. Consequently the power collecting system 100 can ensure communication reliability.

The power measuring device 106 may measure the current power consumption of the appliance at the time interval indicated by the sampling interval 712. In other words, the power measuring device 106 may change, in accordance with the sampling interval 712, the time interval at which the current power consumption of the appliance is measured.

Next, configuration of the measured data 220 will be described.

Figure 4:
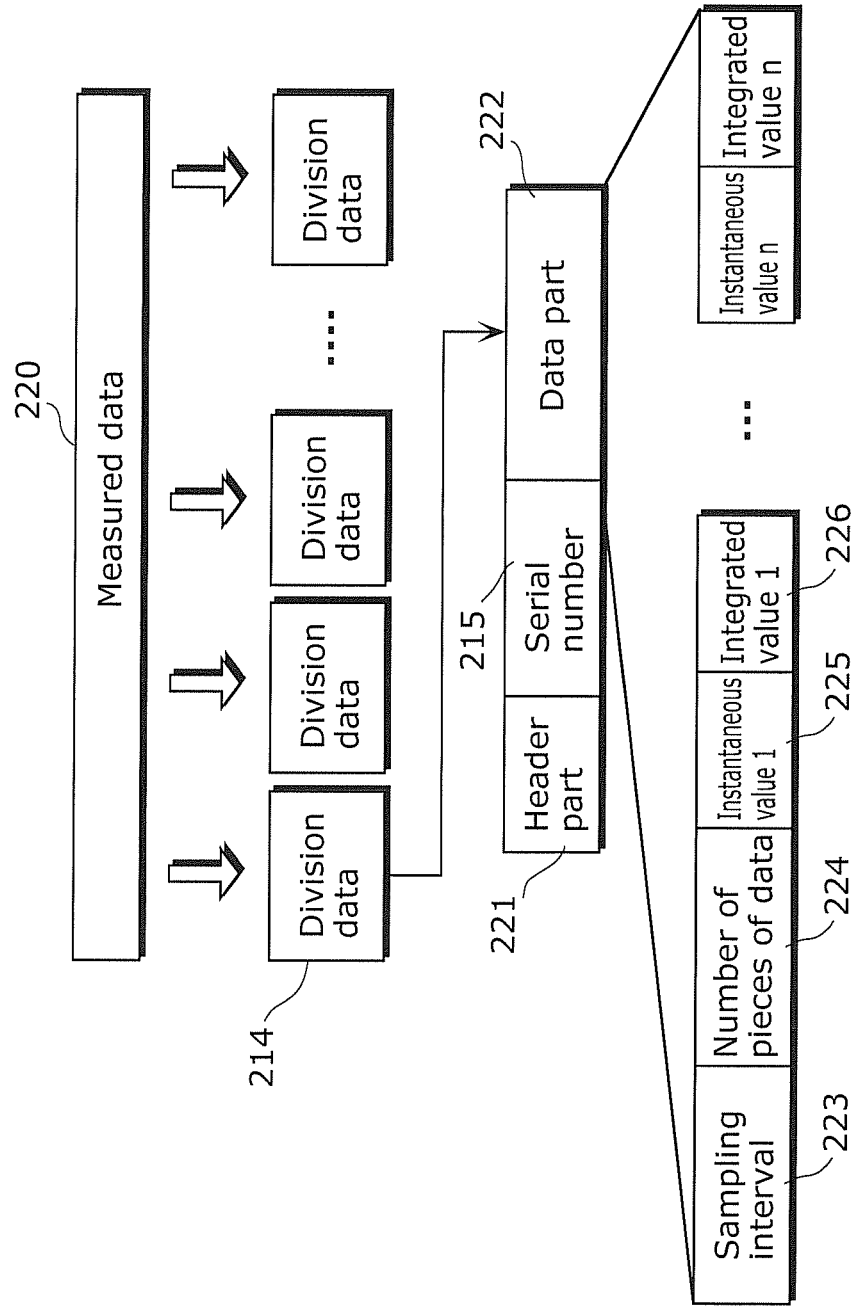
FIG. 4 is a diagram showing configuration of measured data according to Embodiment 1 of the invention.

FIG. 4 is a diagram showing configuration of the measured data 220 and the division data 214.

Here, for example, the network 107 is a communication-control network such as an ECHONET or a ZigBee. Use of such a network limits a message size due to limitation of a network protocol. Here, the message size is a data volume that can be included in one message. Consequently, not all the pieces of measured data 220 may not be transmitted in one message.

In such a case, the measured data transmission unit 406 divides the measured data 220 into a plurality of pieces of division data 214 based on the message size determined by the network protocol.

The pieces of the division data 214 respectively include: header parts 221, the unique serial numbers 215 successive in successive communication, and data parts 222. In the power collecting system 100, use of this serial number 215 permits clarifying which data is missing, if any.

Moreover, the data part 222 includes: a sampling interval 223, the number of times of data transmission or data size 224, an instantaneous value 225 (equal to or larger than 1), and an integrated value 226 (equal to or larger than 1). Note that, if the sampling interval 223 is fixed, the data part 222 may not include the sampling interval 223. Here, the instantaneous value 225 is the current power consumption 411 stored in the buffer unit 403. The integrated value 226 is the accumulated power consumption 412 stored in the buffer unit 403. The sampling interval 223 is an interval between measurement times of a plurality of measured values (instantaneous value 225 and integrated value 226) included in the measured data 220. That is, the sampling interval 223 is a value equal to the sampling interval 712 included in the data transmission request message 213.

Next, a sequence of communication between the power collecting device 101 and the power measuring device 106 will be described.

Figure 5:
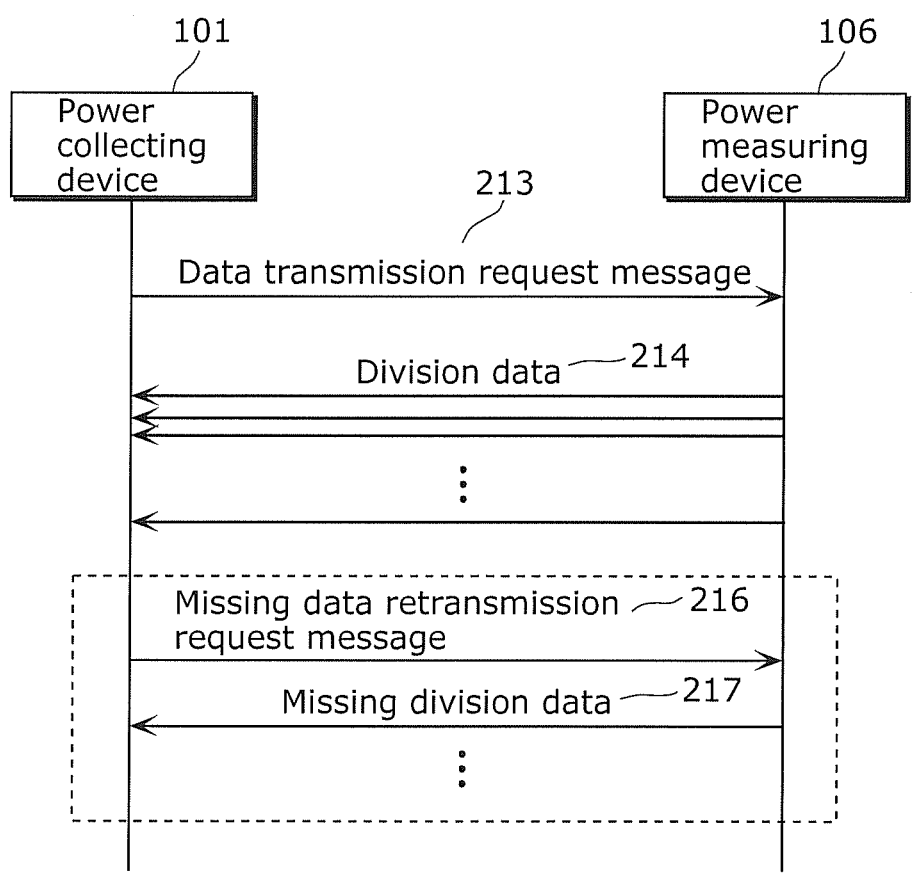
FIG. 5 is a diagram showing a sequence of communication at time of measured data transmission and reception according to Embodiment 1 of the invention.

FIG. 5 is a diagram showing the sequence of communication between the power collecting device 101 and the power measuring device 106.

As shown in FIG. 5, the power collecting device 101 first transmits the data transmission request message 213 to the power measuring device 106.

The power measuring device 106 which has received the data transmission request message 213 divides the measured data 220 into the pieces of division data 214 and transmits the divided pieces of division data 214 to the power collecting device 101.

The power collecting device 101 checks the data size 224 and the serial number 215 to check whether or not all the pieces of division data 214 have been received. If it has been found that any data is missing, the power collecting device 101 transmits the missing data retransmission request message 216 including the serial number 215 to the power measuring device 106. The power measuring device 106 which has received the missing data retransmission request message 216 transmits again to the power collecting device 101 the missing division data 217 as the division data 214 corresponding to the serial number 215 included in the missing data retransmission request message 216.

Next, details of processing of the polling interval determination unit 203 will be described.

Figure 6:
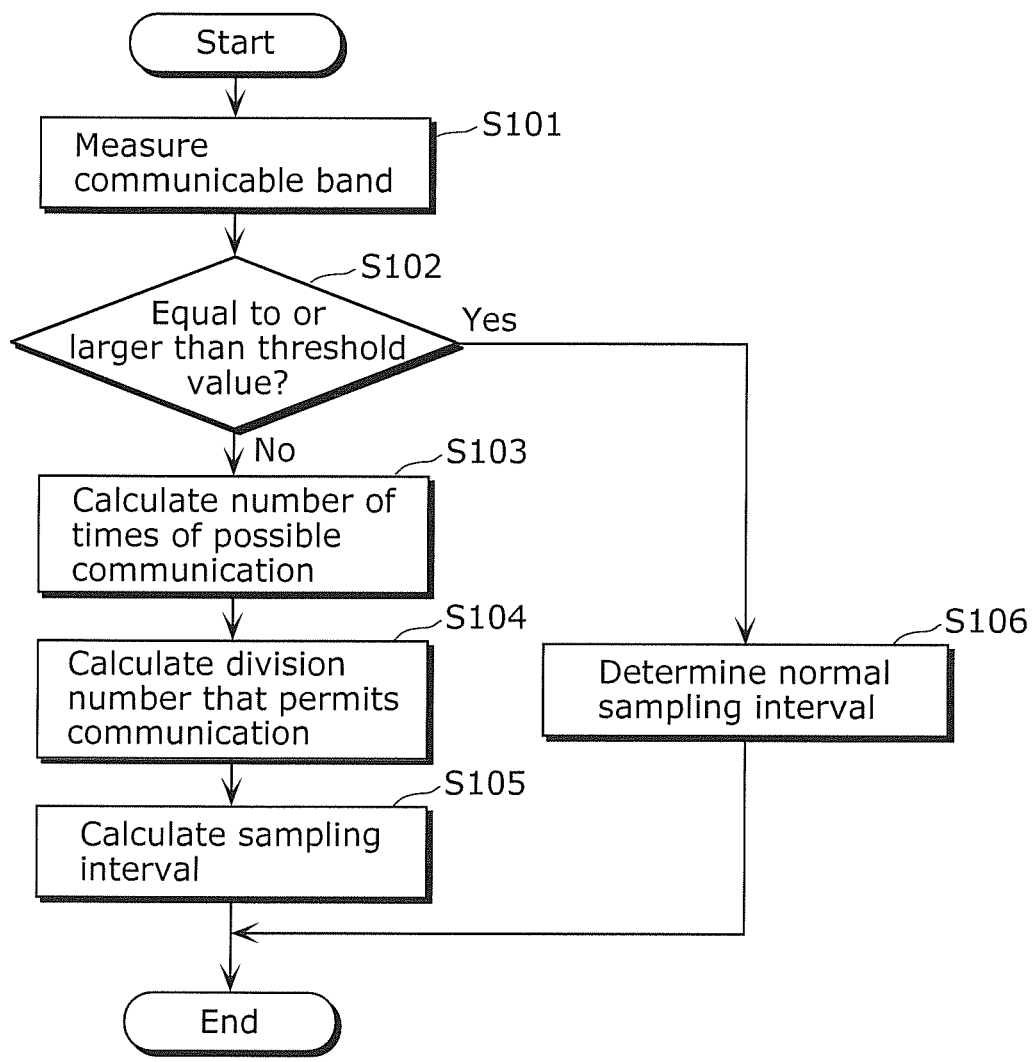
FIG. 6 is a flow chart of sampling interval determination processing by a sampling interval determination unit according to Embodiment 1 of the invention.

FIG. 6 is a diagram showing one example of procedures of sampling interval determination processing by the sampling interval determination unit 710.

First, the band measurement unit 709 measures the communicable band 711 that can be ensured at the present time (S101). For example, the band measurement unit 709 measures the communicable band 711 by monitoring a communication state of the network 107.

Next, the sampling interval determination unit 710 determines whether or not the communicable band 711 is equal to or larger than a predefined threshold value (S102). If the communicable band 711 is equal to or larger than the predefined threshold value (Yes in S102), that is, if a sufficient communication band can be ensured to an extent such that a sequence of acquiring the measured data 220 measured at a normal sampling interval can be completed within the determined polling interval 212, the sampling interval determination unit 710 determines the normal sampling interval as the sampling interval 712 (S106). The normal sampling interval is a predefined default value and a shortest sampling interval.

On the other hand, if the communicable band 711 is less than the predefined threshold value (No in S102), that is, if the sequence of acquiring the measured data 220 measured at the normal sampling interval is not completed with the polling interval 212, that is, if the communication band is not sufficient, the sampling interval determination unit 710 next calculates a division number that permits communication, i.e., the number of pieces of division data 214 that can be communicated in the polling interval 212 in the communication band 711.

Specifically, the sampling interval determination unit 710 first calculates the number of times of communication based on the communicable band 711 (S103).

Here, the number of times of communication is the number of times of communication performed between the power collecting device 101A and the power measuring device 106 by the power collecting device 101A for the purpose of acquiring one piece of measured data 220 from the power measuring device 106. In this example, the number of times of communication is a sum of the number of times (once) of transmission of the data transmission request message 213 by the power collecting device 101A and the number of times (division number n) of transmission of the division data 214 by the power measuring device 106. Note that a relationship between this number of times of communication and the division number varies in accordance with the communication sequence.

Specifically, the sampling interval determination unit 710 calculates the number of times of possible communication by multiplying together the number of times of normal communication and a ratio (hereinafter referred to as communicable band ratio) of the current communicable band 711 with respect to a maximum communication band (for example, the predefined threshold value). Here, the number of times of normal communication is the number of times of communication when the normal sampling interval is used.

Next, the sampling interval determination unit 710, by using the calculated number of times of possible communication, calculates the division number that permits communication (S104). Specifically, the sampling interval determination unit 710, by subtracting 1 as a number corresponding to the transmission of the data transmission request message 213 from the calculated number of times of possible communication, calculates the division number that permits communication.

Next, the sampling interval determination unit 710 calculates the sampling interval 712 based on the calculated the division number that permits communication (S105). Specifically, the sampling interval determination unit 710 calculates the sampling interval 712 by dividing the normal sampling interval by a ratio of the division number that permits communication with respect to a normal division number. The normal division number is a division number when the normal sampling interval is used.

Hereafter, a more detailed example will be described. Assumed here is that the polling interval 212 is 90 seconds, the normal sampling interval is one second, the normal division number is nine, and the number of times of normal communication is 10 (=1+9).

First, an example in which the communicable band ratio is 1/2 will be described.

In this case, the sampling interval determination unit 710 calculates the number of times of possible communication as 5 (=10×1/2) (S103). The sampling interval determination unit 710 calculates the division number that permits communication as 4 (=5−1) (S104). Next, the sampling interval determination unit 710 calculates the sampling interval 712 as 9/4 seconds (=one second×9/4)(S105). Consequently, the measured data transmission unit 406 of the power measuring device 106 evenly selects, from among 90 pieces of data measured at the one-second interval, the 40 pieces of data, and transmits the measured data 220 including the selected data to the power collecting device 101A. That is, the measured data transmission unit 406, from among the 90 pieces of data measured at the one-second interval, makes a selection every two pieces of data or every three pieces of data.

Next, an example in which the communicable band ratio is 1/3 will be described.

In this case, the sampling interval determination unit 710 calculates the number of times of possible communication as 3 (=10×1/3: decimal points are cut off) (S103). Next, the sampling interval determination unit 710 calculates the division number that permits communication as 2 (=3−1) (S104). Next, the sampling interval determination unit 710 calculates the sampling interval 712 as 4.5 seconds (=1 second×9/2) (S105). Consequently, the measured data transmission unit 406 of the power measuring device 106, from among the 90 pieces of data measured at the one-second interval, the 20 pieces of data, evenly selects, and transmits the measured data 220 including the selected data to the power collecting device 101A. That is, the measured data transmission unit 406, from among the 90 pieces of data measured at the one-second interval, makes a selection every four pieces of data and every five pieces of data alternately.

Next, an example in which the communicable band ratio is 3/4 will be described.

In this case, the sampling interval determination unit 710 calculates the number of times of possible communication as 7 (=10×3/4: decimal points are cut off) (S103). Next, the sampling interval determination unit 710 calculates the division number that permits communication as 6 (=7−1) (S104). Next, the sampling interval determination unit 710 calculates that the sampling interval 712 as 1.5 seconds (=1 second×9/6) (S105). Consequently, the measured data transmission unit 406 of the power measuring device 106 evenly selects, from among the 90 pieces of data measured at the one-second interval, the 60 pieces of data, and transmits the measured data 220 including the selected data to the power collecting device 101A. That is, the measured data transmission unit 406, from among the 90 pieces of data measured at the one-second interval, makes a selection every piece of data and every two pieces of data alternately.

As described above, the sampling interval determination unit 710 can determine in accordance with the communicable band 711 an appropriate sampling interval 712 that permits the communication sequence of the measured data 220 to complete at the polling interval 212.

Based on the above, when the communicable band 711 has narrowed, the power collecting device 101 according to Embodiment 1 of the invention can decrease the sampling interval 712 to thereby reduce the data volume of the measured data 220 transmitted by the power measuring device 106. Consequently, the power collecting device 101 can prevent loss and delay in acquisition of the pieces of the measured data 220 transmitted by the different appliances due to, for example, collision between the pieces of the measured data 220 on the network as a result of not completing the transmission of the measured data 220 in the polling interval 212. In this manner, the power collecting device 101 can realize favorable data collection even when a network band has narrowed at time of communication.

(Second Embodiment)

A power collecting device 101A according to Embodiment 2 of the invention has, in addition to functions of the power collecting device 101 according to Embodiment 1 described above, a function of determining an appropriate polling interval.

Figure 7:
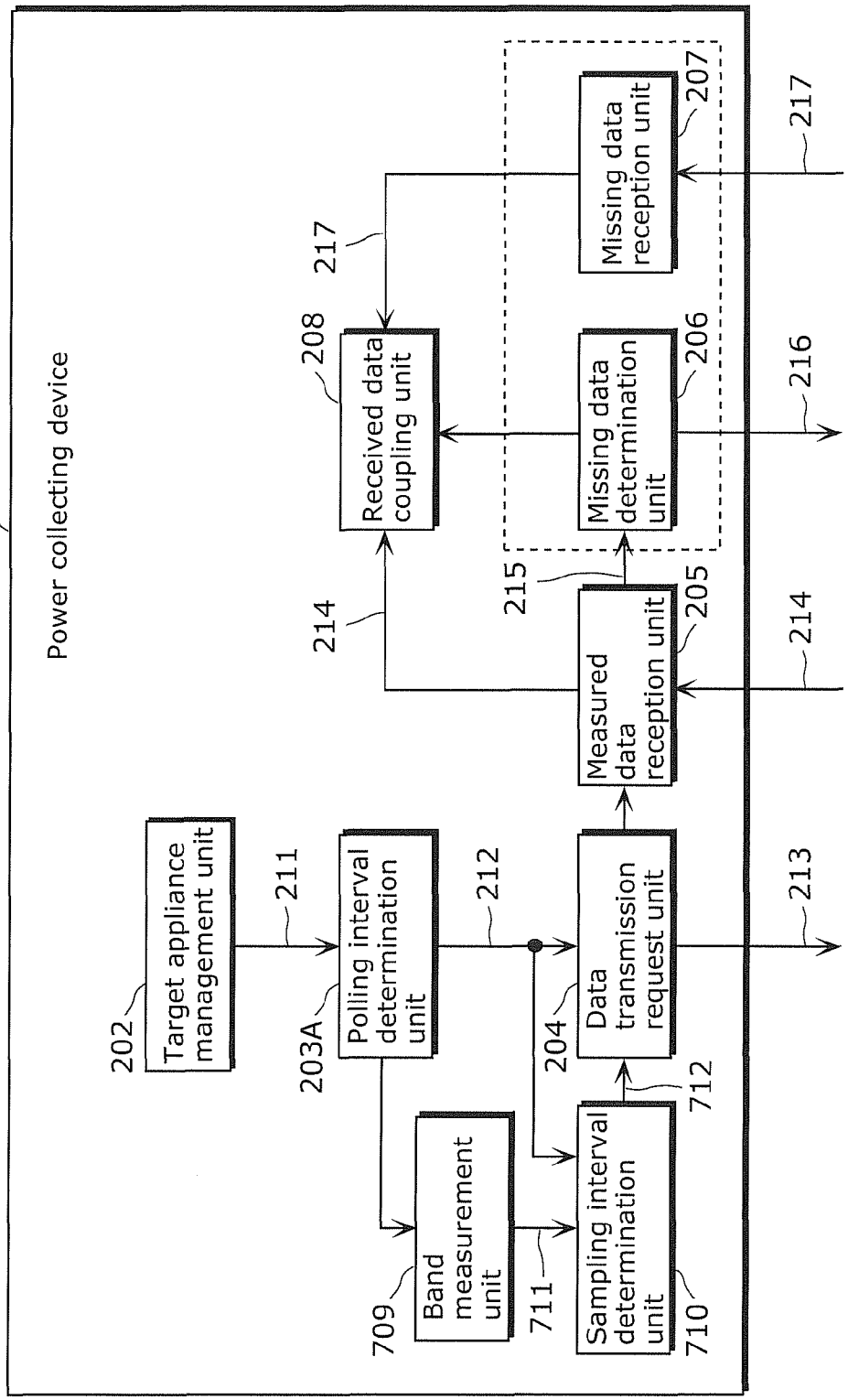
FIG. 7 is a block diagram of a power collecting device according to Embodiment 2 of the invention.

FIG. 7 is a diagram showing functional configuration of the power collecting device 101A according to Embodiment 2 of the invention. Components same as those of FIG. 2 are provided with the same numerals and thus overlapping description will be omitted.

The power collecting device 101A includes, in addition to the configuration of the power collecting device 101 shown in FIG. 2, a target appliance management unit 202. A function of a polling interval determination unit 203A differs from that of the polling interval determination unit 203.

The target appliance management unit 202 manages appliance information 211 of appliances 102 to 105. Specifically, the target appliance management unit 202 manages the number of connections of the managed appliances and pieces of information specific to the respective appliances. Here, the information specific to the appliance includes an address (or communication access destination), a model name, a product number, a vendor name, control information, and monitoring information of the appliance. The target appliance management unit 202 passes to the polling interval determination unit 203A, of the information included in the appliance information, the number of connections of the appliances and the address and monitoring information required for acquiring information related to power consumption of each appliance.

The polling interval determination unit 203A determines a polling interval 212 by using the number of connections of the appliances received from the target appliance management unit 202, communication speed, and limitations of network protocol specifications. Moreover, the polling interval determination unit 203A passes the determined polling interval 212 to a data transmission request unit 204. Here, the communication speed is communication speed defined for each kind of transfer medium.

Specifically, the polling interval determination unit 203A first calculates by using the communication speed and the network protocol specifications a measured data acquisition time period that is a time period from when the data transmission request unit 204 transmits the data transmission request message 213 to when the measured data 220 is acquired. Moreover, the network protocol specifications include an upper limit of message size and communication sequence information.

Here, the communication sequence information is, for example, information indicating a format of a sequence of communication between the power collecting device 101A and the power measuring device 106. For example, the communication sequence format is a format in which a plurality of pieces of successive division data 214 are transmitted for one data transmission request message 213 as shown in FIG. 5, or a format in which only one piece of division data 214 is transmitted for one data transmission request message 213.

Next, the polling interval determination unit 203A calculates the polling interval 212 by multiplying together the measured data acquisition time period and the number of connections.

The data transmission request unit 204 transmits, at an interval indicated by the polling interval 212 received from the polling interval determination unit 203A, the data transmission request message 213 that requests the power measuring device 106 connected to the network 107 for transmitting the measured data.

Next, details of processing of the polling interval determination unit 203A will be described.

Figure 8:
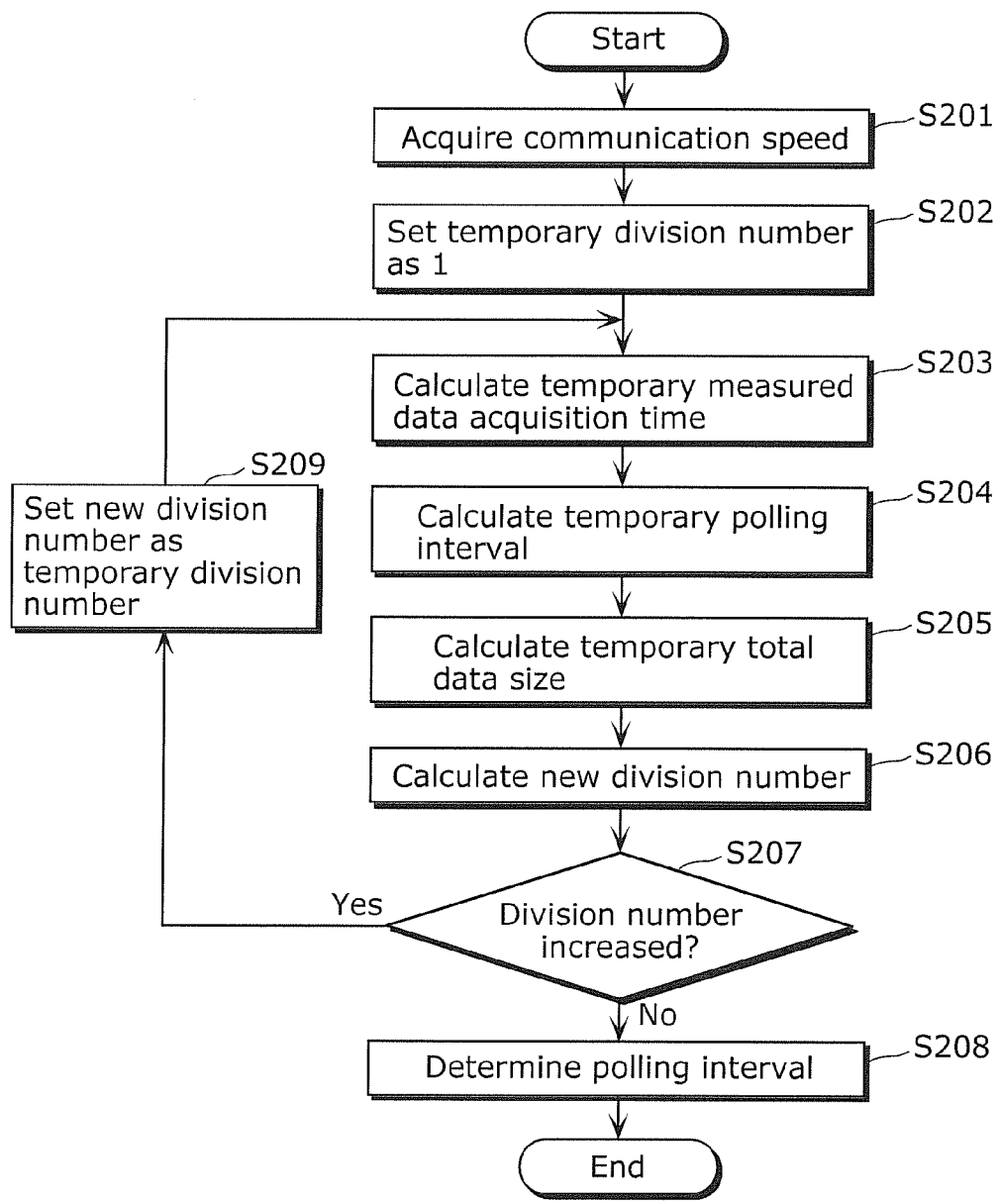
FIG. 8 is a flow chart of polling interval determination processing by a polling interval determination unit according to Embodiment 2 of the invention.

FIG. 8 is a diagram showing one example of procedures for determining the polling interval by the polling interval determination unit 203A.

First, the polling interval determination unit 203A acquires communication speed based on a kind of the network 107 in use (S201).

Next, the polling interval determination unit 203A calculates a temporary polling interval.

Assumed below is that the communication speed is 10 kbps, a maximum size of the data part 222 of one piece of division data 214 is 100 bytes, a normal sampling interval is one second, and a data size of a measured vale measured by the power measuring device 106 each second is 10 bytes. The measured value here is total data of one instantaneous value 225 and one integrated value 226.

First, the polling interval determination unit 203A sets a temporary division number as 1 (S202).

Next, the polling interval determination unit 203A, by using the communication speed, the temporary division number, and the number of connections of the appliances, calculates a temporary measured data acquisition time period (latency) for the acquisition between the power collecting device 101 and one power measuring device 106 (S203).

FIG. 9 is a diagram showing a detailed example of the polling interval calculated by the polling interval determination unit 203A.

For example, the polling interval determination unit 203A calculates the measured data acquisition time period by using formula below (formula 1).

Measured data acquisition time period=(required transmission time period+n×division data transmission time period+internal processing time period)×2  (formula 1), where n is the division number.

Moreover, the required transmission time period is a time period required for the power collecting device 101 to transmit the data transmission request message 213 to the power measuring device 106. For example, in this case, the required transmission time period is 0.1 seconds including a margin.

Moreover, the division data transmission time period is a time period required for the power measuring device 106 to transmit one piece of division data 214 to the power collecting device 101. For example, in this case, the division data transmission time period is 0.1 seconds including a margin.

The internal processing time period is a time period required for the power measuring device 106 to transmit the first division data 214 after reception of the data transmission request message 213. For example, the internal processing time period is 0.5 seconds.

Moreover, (required transmission time period+n×division data transmission time period+internal processing time period) is doubled in formula (1) above for the purpose of ensuring the margin. Moreover, for this coefficient, a time period required for processing upon the occurrence of missing data described above is taken into consideration. Note that in the (formula 1) above, (required transmission time period+ n×division data transmission time period+internal processing time period) may be multiplied by a coefficient other than 2.

Moreover, here, the temporary division number is 1, and thus the polling interval determination unit 203A calculates the temporary data acquisition time period as 1.4 seconds (=(0.1+1×0.1+0.5)×2).

Next, the polling interval determination unit 203A calculates the temporary polling interval by multiplying together the temporary measured data acquisition time period and the number of connections (S204). Here, the temporary measured data acquisition time period is 1.4 seconds and the number of connections is 30, and thus the temporary polling interval is 42 seconds.

Next, the polling interval determination unit 203A calculates a temporary total data size of data measured by the power measuring device 106 during one temporary polling interval (S205). Here, the temporary polling interval is 42 seconds and the data size per second measured by the power measuring device 106 is 10 bytes, and thus the temporary total data size is 420 bytes.

Next, the polling interval determination unit 203A calculates a new division number based on the temporary total data size (S206). Specifically, the polling interval determination unit 203A calculates the new division number by dividing the temporary total data size by the maximum data size of the division data 214. Here, the total data size is 420 bytes and the maximum size of the data part 222 of one piece of division data 214 is 100 bytes, and thus 5 is calculated as the new division number.

Next, the polling interval determination unit 203A determines whether or not an original division number (temporary division number) is equal to the new division number (S207). Here, the original division number is 1 and the new division number is 5, and thus the original division number does not agree with the new division number (No in S207).

If the original division number does not agree with the new division number (No in S207), the polling interval determination unit 203A sets the new division number as the temporary division number (S209) and then performs the processing of steps S203 to 207.

Here, where the division number (n) increases, the measured data acquisition time period, the polling interval, and the total data size each increase. When an increment of this total data size is large, the division number (n) further increases. When the increment of the total data size is small, the division number (n) does not increase and converges.

In the example shown in FIG. 9, where the temporary division number (n) is 5, the polling interval determination unit 203A calculates 2.2 seconds as the temporary measured data acquisition time period, calculates 66 seconds as the temporary polling interval, calculates 660 bytes as the temporary total data size, and calculates 7 as the new division number (n).

The original division number (n)=5 and the new division number (n)=7 do not agree with each other (No in S207), the polling interval determination unit 203A sets the new division number (n)=7 as the temporary division number (S209), and performs the processing of steps S203 to S207. Consequently, the new division number (n)=8 is calculated.

As described above, the polling interval determination unit 203A repeats the processing of steps S203 to S207, whereby the original division number (n) and the new division number (n) agree with each other at a stage where the temporary division number (n)=9 (Yes in S207).

If the original division number (n) and the new division number (n) agree with each other (Yes in S207), the polling interval determination unit 203A determines the temporary polling interval with this division number (n) as the polling interval 212 (S208). In the example shown in FIG. 9, the polling interval determination unit 203A determines the polling interval 212 as 90 seconds.

As described above, the power collecting device 101A according to Embodiment 2 of the invention can determine an appropriate polling interval 212 even with any combination of conditions including the number of connections of appliances connected to the network 107, the network protocol, the transfer medium, etc.

As a result, the power collecting device 101A according to Embodiment 2 of the invention can acquire current power consumption and accumulated power consumption data that is detailed on an individual appliance basis, for example, in units of one second, even with any combination of the conditions including the number of connections of appliances connected to the network 107, the network protocol, the transfer medium, etc. Therefore, the power collecting device 101 can recognize detailed operation contents of each appliance, and thus can clearly show to the consumer unnecessary power usage in a household. Moreover, upon execution of a service such as demand side management or demand response, the power collecting device 101 can also execute control of each appliance without giving discomfort to the user. Consequently, the power collecting device 101 can realize peak shift and peak cut of the power consumption.

In the example shown in FIG. 8, the polling interval determination unit 203A uses 1 as an initial value for the temporary division number in step S202, but may use a value other than 1.

Moreover, the description above refers to an example in which the power collecting device 101A has a function of determining both the sampling interval 712 and the polling interval 212, but the sampling interval 712 may be a predetermined value (for example, normal sampling interval).

Figure 10:
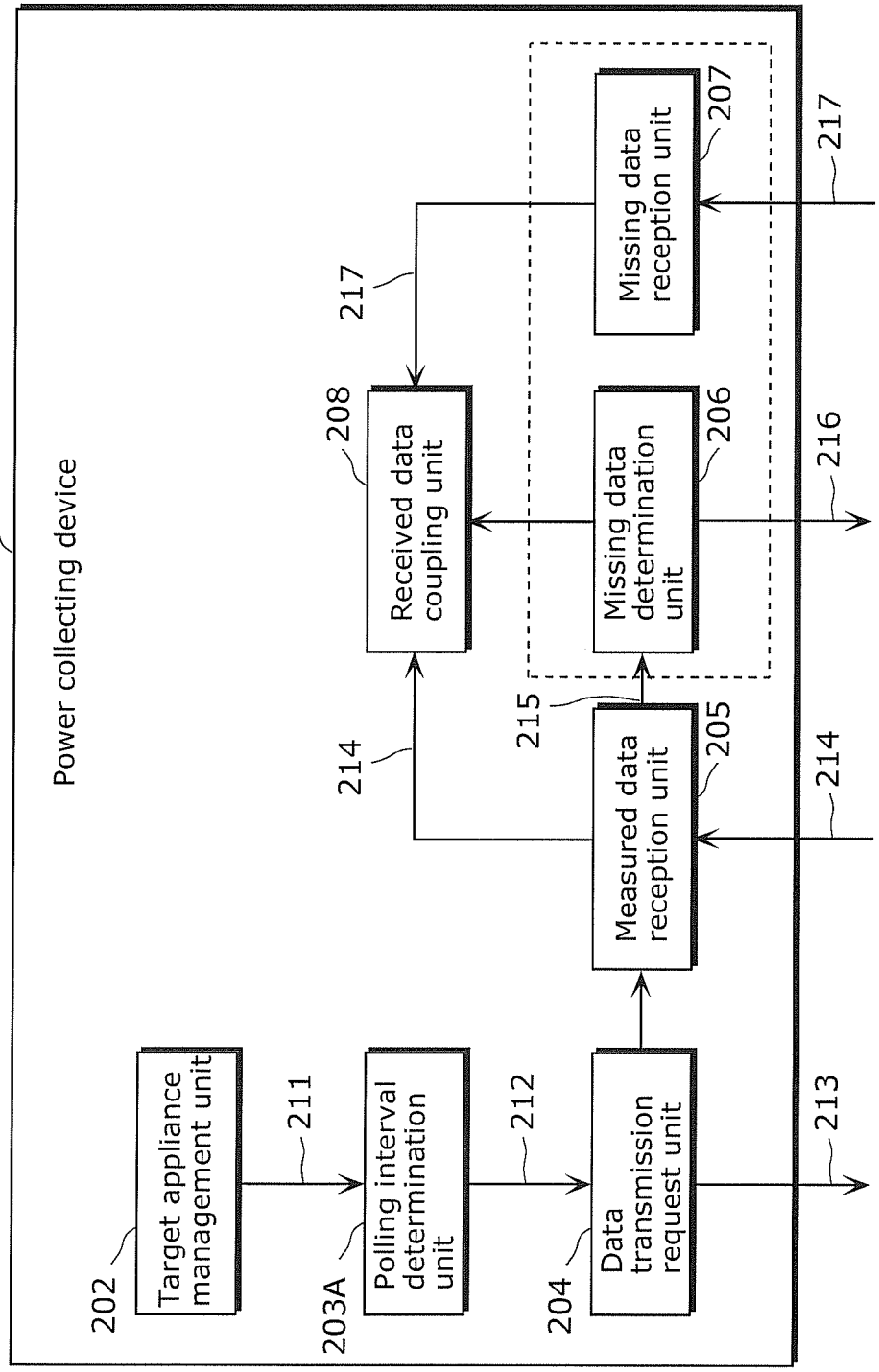
FIG. 10 is a block diagram of a modified example of the power collecting device according to Embodiment 2 of the invention.

FIG. 10 is a block diagram showing configuration of a power collecting device 101B as a modified example of the power collecting device 101A according to Embodiment 2 of the invention.

As shown in FIG. 10, the power collecting device 1016 may not include the band measurement unit 709 and the sampling interval determination unit 710.

(Embodiment 3)

In Embodiment 3 of the invention, a description will be given, referring to an example in which the sampling interval determination processing by the power collecting device 101 according to Embodiment 1 of the invention described above is performed by the power measuring device 106.

Figure 11:
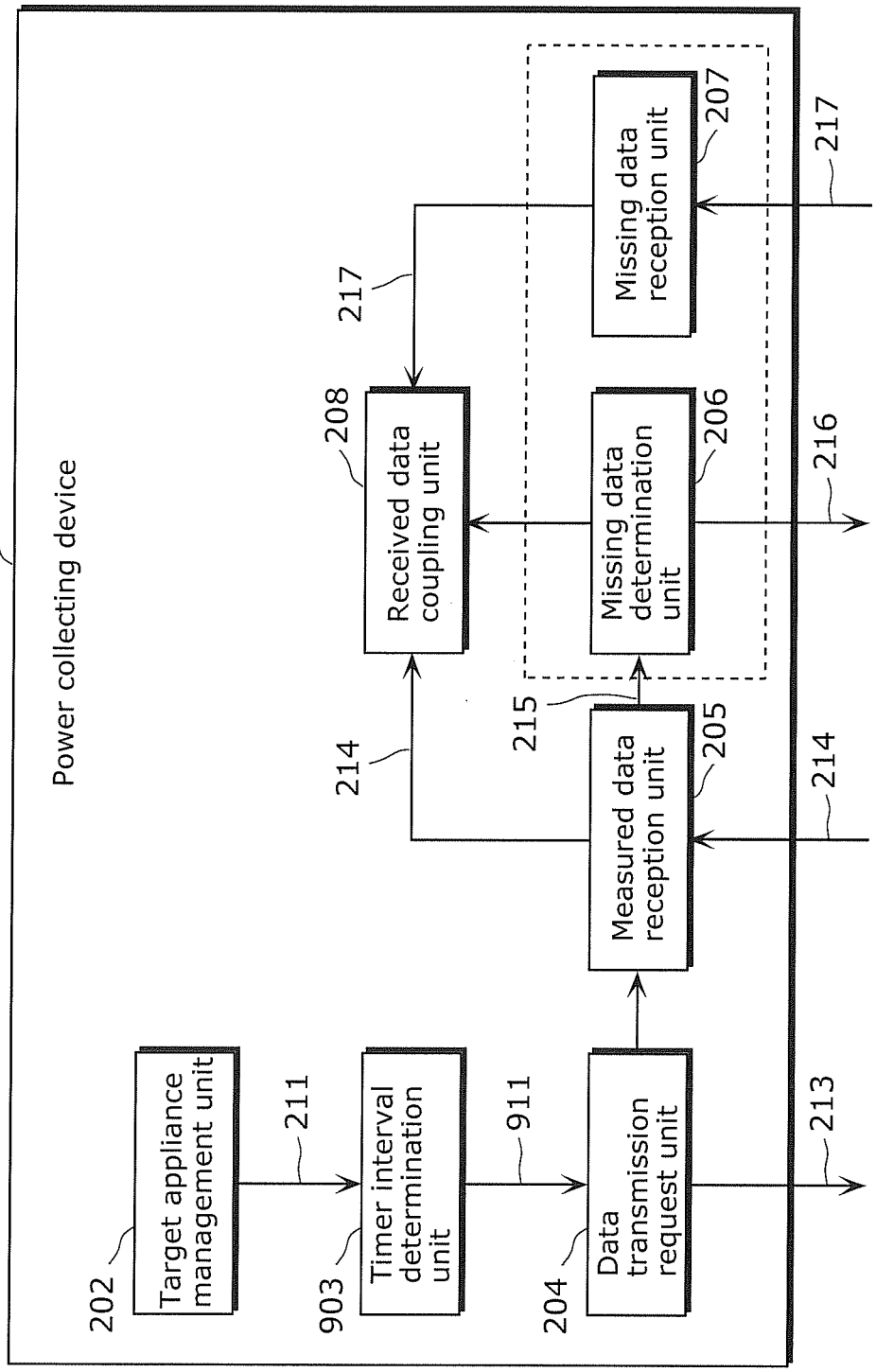
FIG. 11 is a block diagram of a power collecting device according to Embodiment 3 of the invention.

FIG. 11 is a block diagram showing functional configuration of a power collecting device 101C according to Embodiment 3 of the invention.

The power collecting device 101C shown in FIG. 11, unlike the power collecting device 101A shown in FIG. 7, includes a timer interval determination unit 903 instead of the polling interval determination unit 203. Moreover, the power collecting device 101C does not include the band measurement unit 709 and the sampling interval determination unit 710.

The timer interval determination unit 903 determines a timer interval 911 by using the number of connections of the appliance received from a target appliance management unit 202, the communication speed, and limitation of the network protocol specifications. Moreover, the timer interval determination unit 903 passes the determined timer interval 911 to a data transmission request unit 204. Here, the timer interval 911 is a time interval at which the power measuring device 106C transmits the measured data 220.

The data transmission request unit 204 generates a data transmission request message 213 including the timer interval 911 received from the timer interval determination unit 903. This data transmission request message 213 is a message requesting the power measuring device 106C for transmitting the measured data 220 at the timer interval 911.

Moreover, a method of determining the timer interval 911 by the timer interval determination unit 903 is, for example, the same as a method of determining the polling interval 212 by the polling interval determination unit 203A described in Embodiment 2. That is, the polling interval 212 in the method of determining the polling interval 212 by the polling interval determination unit 203 may be replaced with the timer interval 911.

Note that the timer interval determination unit 903 may determine a predefined value or a value specified from the outside as the timer interval 911.

Figure 12:
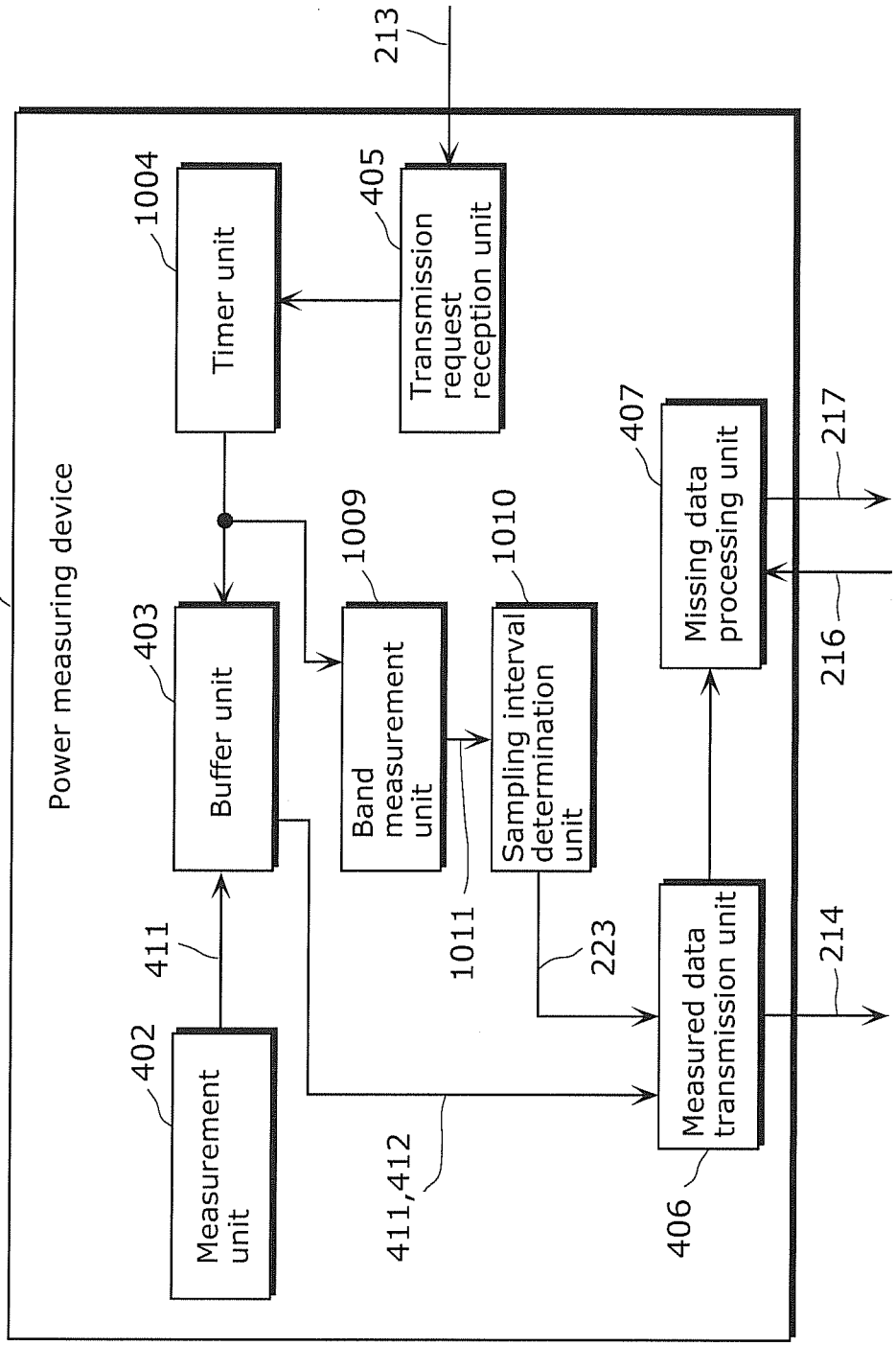
FIG. 12 is a block diagram of a power measuring device according to Embodiment 3 of the invention.

FIG. 12 is a block diagram showing functional configuration of the power measuring device 106C. Components same as those of FIG. 3 are provided with the same numerals.

The power measuring device 106C, unlike the power measuring device 106 shown in FIG. 3, further includes a timer unit 1004, a band measurement unit 1009, and a sampling interval determination unit 1010

The timer unit 1004 requests the buffer unit 403 for transmitting the measured data to power collecting device 101C at the timer interval 911 included in the data transmission request message 213 received by the transmission request reception unit 405.

The band measurement unit 1009 measures a communicable band 1011 at time of transmitting the measured data 220 to the power collecting device 101C, that is, at each timer interval 911.

The sampling interval determination unit 1010 determines a sampling interval 223 indicating a time interval at which the instantaneous value 225 and the integrated value 226 included in the measured data 220 are measured. Contents of processing by the sampling interval determination unit 1010 are the same as those of the processing by the sampling interval determination unit 710 described in Embodiment 1.

Moreover, the measured data transmission unit 406 transmits, to the power collecting device 101A at the time interval indicated by the timer interval 911, for example, of a plurality of pieces of data measured at the one-second interval, the plurality of pieces of division data 214 including data for the sampling interval 223 determined at the sampling interval determination unit 1010.

As described above, the power measuring device 106C according to Embodiment 3 of the invention increases the sampling interval 223 when the communicable band 1011 has become narrower than normal one at time of data transmission. Consequently, the data volume of the measured data 220 transmitted by the power measuring device 106C can be reduced. Therefore, the power measuring device 106C can prevent loss and delay of the measured data 220 as a result of not completing the transmission of the measured data 220 in the polling interval 212. As described above, the power collecting system 100 using the power collecting device 101C and the power measuring device 106C can realize favorable data collection even when the band of the network has narrowed at time of communication.

The power collecting devices and the power measuring devices according to the embodiments of the invention have been described above, but the invention is not limited to these embodiments.

For example, Embodiments 1, 2, and 3 have been described, referring to the examples in which the measured data obtained by measuring the power consumption is collected, but the invention may be applied to collection of data of other utility-related data (for example, an amount of gas used or an amount of water used). Further, the invention is applicable to typical data collection.

Moreover, the processing units included in the power collecting devices and the power measuring devices according to Embodiments 1 to 3 are typically realized as an LSI as an integrated circuit. However, they may be individually put into one chip, or may be put into one chip including part or all thereof.

Here, the LSI is provided, but depending on a difference in integration degree, they may be called as an IC, a system LSI, a super LSI, or an ultra LSI.

Moreover, creating an integrated circuit may be realized not only by the LSI but also by a special circuit or a general-purpose processor. An FPGA (Field Programmable Gate Array) that can be programmed after LSI production or a reconfigurable processor that can reconfigure connection and settings of circuit cells in the LSI may be used.

Further, upon introduction of a technology of creating an integrated circuit in place of an LSI as a result of advancement of semiconductor technologies or a different technology, needless to say, this technology may be used for integration of the processing units.

Moreover, part or all of functions of the power collecting devices and the power measuring devices according to Embodiments 1 to 3 of the invention may be realized by executing a program by a processor such as a CPU.

Further, the invention may be the program described above, or may be a recording medium on which the program described above is recorded. Moreover, it is needless to say that the program described above can be circulated via a transfer medium such as the Internet.

Moreover, at least part of the functions of the power collecting devices and the power measuring devices according to Embodiments 1 to 3 described above and also their modified examples may be combined together.

Moreover, the numbers used above are just illustrative for detailed description of the invention, and thus the invention is not limited to the illustrated numbers.

Further, the invention also includes various modified examples obtained by adding modifications to the embodiments within a range through by those skilled in the art without departing from the spirits of the invention.

INDUSTRIAL APPLICABILITY

The invention is applicable to a power collecting device and a power measuring device. The invention is also useful for a home network system including such a power collecting device and such a power measuring device.

REFERENCE NUMERAL LIST

100 Power collecting system
101, 101A, 101B, 101C Power collecting device
102, 103, 104, 105 Appliance
106, 106C Power measuring device
107 Network
202 Target appliance management unit 203, 203A Polling interval determination unit
204 Data transmission request unit
205 Measured data reception unit
206 Missing data determination unit
207 Missing data reception unit
208 Received data coupling unit
211 Appliance information
212 Polling interval
213 Data transmission request message
214 Division data
215 Serial number
216 Missing data retransmission request message
217 Missing division data
220 Measured data
221 Header part
222 Data part
223, 712 Sampling interval
224 Data size
225 Instantaneous value
226 Integrated value
402 Measurement unit
403 Buffer unit
405 Transmission request reception unit
406 Measured data transmission unit
407 Missing data processing unit
411 Current power consumption
412 Accumulated power consumption
709, 1009 Band measurement unit
710, 1010 Sampling interval determination unit
711, 1011 Communicable band
903 Timer interval determination unit
911 Timer interval
1004 Timer unit

The invention claimed is:

1. A power collecting device being connected to a network and collecting, from an appliance connected to the network, measured data including one or a plurality of pieces of at least one kind of data of current power consumption and accumulated power consumption of the appliance, said power collecting device comprising:
a polling interval determination unit configured to determine a polling interval as a time interval at which the measured data is collected from the appliance;
a band measurement unit configured to measure a communicable band usable for communication between said power collecting device and the appliance;
a sampling interval determination unit configured to determine a sampling interval as an interval between measurement times of a plurality of measured values included in the measured data so that a data volume of the measured data defined by the sampling interval and the polling interval becomes equal to or smaller than a data volume that can be communicated within the polling interval by using the communicable band; and
a data transmission request unit configured to transmit, to the appliance at the polling interval, a request message requesting the appliance for transmitting the measured data including the measured value obtained through the measurement at the sampling interval.

2. The power collecting device according to claim 1, wherein the appliance determines, based on an upper limit of a data volume of one message, whether or not to divide the measured data for transmission, and when the measured data is to be divided, divides the measured data into a plurality of pieces of division data and transmits the divided plurality of pieces of division data to said power collecting device, and when the measured data is not to be divided, transmits the measured data to said power collecting device without dividing the measured data, and
said sampling interval determination unit is configured:
to determine, when the communicable band is wider than a predefined first band, the sampling interval as the predefined first interval;
to calculate, when the communicable band is narrower than the first band, a division number that permits communication as the number of pieces of division data that can be communicated within the polling interval by using the communicable band, and
to calculate a second interval by dividing the first interval by a ratio of the division number that permits communication with respect to a normal division number as the number of pieces of division data when the first interval is used, and determine the calculated second interval as the sampling interval.

3. The power collecting device according to claim 1, further comprising a target appliance management unit configured to hold the number of connections as the number of the appliances connected to the network,
wherein said polling interval determination unit is configured to determine the polling interval by using the number of connections, communication speed of the network, and network protocol specifications.

4. The power collecting device according to claim 3,
wherein said polling interval determination unit is configured to:
to calculate, by using the communication speed and the network protocol specifications, a measured data acquisition time period as a time period from when said data transmission request unit transmits the request message to when the measured data is acquired; and
to calculate the polling interval by multiplying together the measured data acquisition time period and the number of connections.

5. The power collecting device according to claim 4,
wherein the appliance divides the measured data into a plurality of pieces of division data whose upper limits of data volumes are defined, and transmits the divided plurality of pieces of division data to said power collecting device, and
said polling interval determination unit is configured:
to set a predefined number as a first division number;
to repeat: calculating, based on the communication speed, a temporary measured data acquisition time period as the measured data acquisition time period when the measured data is transmitted after divided into the first division number of pieces of division data; calculating a temporary polling interval by multiplying together the temporary measured data acquisition time period and the number of connections; calculating a temporary data volume as a data volume of the measured data with the temporary polling interval and the first division number; calculating a second division number by dividing the temporary data volume by a maximum data volume of the division data; and, when the first division number is different from the second division number, setting the second division number as a new first division number, until when the first division number and the second division number become equal to each other; and
to determine the temporary polling interval as the polling interval when the first division number and the second division number become equal to each other.

6. The power collecting device according to claim 4,
wherein the network protocol specifications include an upper limit of a message size and communication sequence information, and
said polling interval determination unit is configured to calculate the measured data acquisition time period by using the communication speed of the network, the upper limit of the message size, and the communication sequence information.

7. The power collecting device according to claim 4, further comprising:
a data reception unit configured to receive the plurality of pieces of division data obtained by dividing the measured data;
a received data coupling unit configured to couple together the pieces of division data received by the data reception unit;
a missing data determination unit configured to determine, based on a parameter included in the division data, whether or not there is any missing data, and when there is any missing data, request the appliance for transmitting the missing data again; and
a missing data reception unit configured to receive the missing data from the appliance,
wherein said polling interval determination unit is configured to calculate the measured data acquisition time period by multiplying a coefficient that considers occurrence of the missing data by the value calculated based on the communication speed.

8. The power collecting device according to claim 3,
wherein said target appliance management unit is further configured to hold an address or a communication access destination of the appliance.

9. A power collecting device being connected to a network and collecting, from an appliance connected to the network, measured data including a plurality of measured values indicating current power consumption of the appliance for each time measured by the appliance, said power collecting device comprising:
a target appliance management unit configured to hold the number of connections as the number of the appliances connected to the network;
a timer interval determination unit configured to determine, based on the number of connections, communication speed of the network, and network protocol specifications, a timer interval as a time interval at which the appliance transmits the measured data to said power collecting device; and
a data transmission request unit configured to transmit to the appliance a request message requesting the appliance for transmitting the measured data at the timer interval.

10. A power measuring device measuring current power consumption of an appliance and transmitting, to a power collecting device connected to a network, measured data including at least one of the current power consumption and accumulated power consumption, said power collecting device comprising:
a measurement unit configured to measure the current power consumption of the appliance for each time and outputting a measured value obtained through the measurement;
a transmission request reception unit configured to receive a request message transmitted from said power collecting device, the message including a timer interval as a time interval at which said power measuring device transmits the measured data to said power collecting device;
a band measurement unit configured to measure a communicable band usable for communication between said power measuring device and said power collecting device;
a sampling interval determination unit configured to determine a sampling interval as an interval between measurement times of a plurality of measured values included in the measured data so that a data volume of the measured data defined by the sampling interval and the timer interval becomes equal to or smaller than a data volume that can be communicated within the timer interval by using the communicable band; and
a measured data transmission unit configured to transmit, to said power collecting device at the timer interval, the measured data including the measured value obtained through the measurement at the sampling interval.

11. The power measuring device according to claim 10,
wherein the measured data transmission unit is configured to determine, based on an upper limit of a data volume of one message, whether or not to divide the measured data for transmission, and when the measured data is to be divided, divide the measured data into a plurality of pieces of division data and transmit the divided plurality of pieces of division data to said power collecting device, and when the measured data is not to be divided, transmit the measured data to said power collecting device without dividing the measured data, and
said sampling interval determination unit is configured: to determine the sampling interval as the predefined first interval when the communicable band is wider than a predefined first band; to calculate, when the communicable band is narrower than the first band, a division number that permits communication as the number of pieces of division data that can be communicated within the polling interval with the communicable band; and to calculate a second interval by dividing the first interval by a ratio of the division number that permits communication with respect to a normal division number as the number of pieces of division data when the first interval is used, and determine the calculated second interval as the sampling interval.

12. A power collecting method in a power collecting device being connected to a network and collecting, from an appliance connected to the network, measured data including one or a plurality of at least one kind of data of current power consumption and accumulated power consumption of the appliance, said power collecting method comprising:
determining a polling interval as a time interval at which the measured data is collected from the appliance;
measuring a communicable band usable for communication between said power collecting device and the appliance;
determining a sampling interval as an interval between measurement times of a plurality of measured values included in the measured data so that a data volume of the measured data defined by the sampling interval and the polling interval becomes equal to or smaller than a data volume that can be communicated within the polling interval by using the communicable band; and
transmitting, to the appliance at the polling interval, a request message requesting the appliance for transmitting the measured data including the measured value obtained through the measurement at the sampling interval.

13. A non-transitory computer-readable recording medium having a recorded program causing a computer to execute the power collecting method according to claim 12.

* * * * *